(12) United States Patent
Lin et al.

(10) Patent No.: US 11,056,365 B2
(45) Date of Patent: Jul. 6, 2021

(54) FAULT DETECTION METHOD IN SEMICONDUCTOR FABRICATION FACILITY

(71) Applicant: Taiwan Semiconductor Manufacturing Co., Ltd., Hsinchu (TW)

(72) Inventors: Hom-Chung Lin, Taichung (TW); Jih-Churng Twu, Hsinchu County (TW); Chin-Yun Chen, Taipei (TW); Tai-Hsiang Lin, Taichung (TW); Yu-Chi Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 496 days.

(21) Appl. No.: 15/800,586

(22) Filed: Nov. 1, 2017

(65) Prior Publication Data

US 2019/0096723 A1 Mar. 28, 2019

Related U.S. Application Data

(60) Provisional application No. 62/563,789, filed on Sep. 27, 2017.

(51) Int. Cl.
*H01L 21/67* (2006.01)
*H01L 21/677* (2006.01)
*G01N 27/22* (2006.01)
*G08B 21/18* (2006.01)
(Continued)

(52) U.S. Cl.
CPC ..... *H01L 21/67276* (2013.01); *G01N 27/223* (2013.01); *G08B 21/182* (2013.01); *G08B 21/20* (2013.01); *G08B 25/10* (2013.01); *H01L 21/67253* (2013.01); *H01L 21/67288* (2013.01);
(Continued)

(58) Field of Classification Search
CPC .... G05B 19/41875; G05B 2219/32187; G05B 2219/45031; H01L 21/67276; H01L 21/67253; H01L 21/67288; H01L 21/67733; H01L 21/67757; H01L 21/67778; G01N 27/223; G08B 21/182
See application file for complete search history.

(56) References Cited

U.S. PATENT DOCUMENTS 9,981,790 B1 * 5/2018 Ost ..................... B65D 51/245
2007/0224712 A1 * 9/2007 Kaushal ............ H01L 21/67253
438/15

(Continued)

*Primary Examiner* — Kyle R Quigley
(74) *Attorney, Agent, or Firm* — McClure, Qualey & Rodack, LLP

(57) ABSTRACT

A method for fault detection in a fabrication tool is provided. The method includes processing a semiconductor wafer in a fabrication tool according to a plurality of process events of a process run. The method further includes measuring humidity in the fabrication tool in at least one of the process events. The method also includes comparing the humidity measured in one of the process events with an expected humidity associated with the process event. In addition, the method includes based on the comparison, indicating an alarm condition when a difference between the measured humidity and the expected humidity exceeds a range of acceptable values associated with the process event.

20 Claims, 13 Drawing Sheets

(51) Int. Cl.
 *G08B 25/10* (2006.01)
 *G08B 21/20* (2006.01)
(52) U.S. Cl.
 CPC .. *H01L 21/67733* (2013.01); *H01L 21/67757* (2013.01); *H01L 21/67778* (2013.01)

(56) References Cited

U.S. PATENT DOCUMENTS

| | | | | |
|---|---|---|---|---|
| 2015/0153296 | A1* | 6/2015 | Gryska | G01N 27/223 73/335.04 |
| 2017/0191897 | A1* | 7/2017 | Mueller | H01L 21/67288 |
| 2017/0313520 | A1* | 11/2017 | Tsai | B65G 17/485 |
| 2017/0328522 | A1* | 11/2017 | Battaglini | H04L 67/12 |
| 2018/0286726 | A1* | 10/2018 | Rebstock | F26B 21/08 |

* cited by examiner

FAULT DETECTION METHOD IN SEMICONDUCTOR FABRICATION FACILITY

PRIORITY CLAIM AND CROSS-REFERENCE

This application claims the benefit of U.S. Provisional Application No. 62/563,789, filed on Sep. 27, 2017, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

ICs are typically fabricated by processing one or more wafers as a "lot" with a series of wafer fabrication tools (i.e., "processing tools"). Each processing tool typically performs a single wafer fabrication task on the wafers in a given lot. For example, a particular processing tool may perform layering, patterning and doping operations or thermal treatment. A layering operation typically adds a layer of a desired material to an exposed wafer surface. A patterning operation typically removes selected portions of one or more layers formed by layering. A doping operation typically incorporates dopants directly into the silicon through the wafer surface, to produce p-n junctions. A thermal treatment typically heats a wafer to achieve specific results (e.g., dopant drive-in or annealing).

Although existing processing tool have been generally adequate for their intended purposes, they have not been entirely satisfactory in all respects. Consequently, there is a need for a processing tool and method thereof that provides a solution for processing ICs efficiently and stably.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
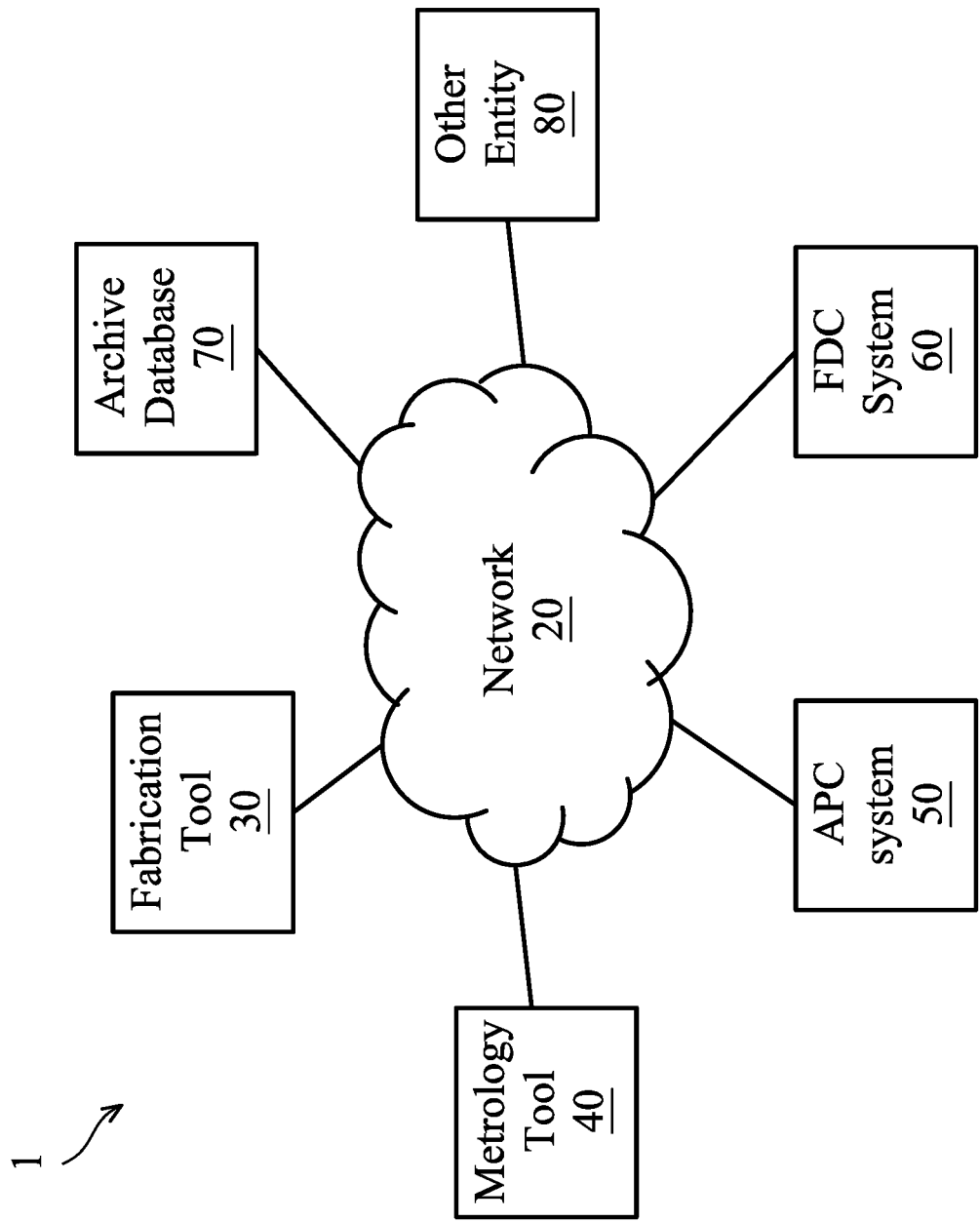
FIG. 1 is a block diagram of a fabrication facility according to various aspects of the present disclosure.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 is a block diagram of a fabrication facility 1 according to various aspects of the present disclosure. The fabrication facility 1 implements integrated circuit manufacturing processes to fabricate integrated circuit devices. For example, the fabrication facility 1 may implement semiconductor manufacturing processes that fabricate semiconductor wafers.

The semiconductor wafer S may be made of silicon or other semiconductor materials. Alternatively or additionally, the semiconductor wafer S may include other elementary semiconductor materials such as germanium (Ge). In some embodiments, the semiconductor wafer S is made of a compound semiconductor such as silicon carbide (SiC), gallium arsenic (GaAs), indium arsenide (InAs), or indium phosphide (InP). In some embodiments, the semiconductor wafer S is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer S includes an epitaxial layer. For example, the semiconductor wafer S has an epitaxial layer overlying a bulk semiconductor. In some other embodiments, the semiconductor wafer S may be a silicon-on-insulator (SOI) or a germanium-on-insulator (GOI) substrate.

The semiconductor wafer S may have various device elements. Examples of device elements that are formed in the semiconductor wafer S include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the fabrication facility 1 includes a network 20 that enables various entities (a fabrication tool 30, a metrology tool 40, an advanced process control (APC) system 50, a fault detection and classification (FDC) system 60, an archive database 70, and other entity 80) to communicate with one another. It should be noted that, in FIG. 1, the fabrication facility 1 has been simplified for the sake of clarity to better understand the inventive concepts of the present disclosure. Additional features can be added in the fabrication facility 1, and some of the features described below can be replaced or eliminated in other embodiments of the fabrication facility 1. The fabrication facility 1 may include more than one of each of the entities in the depicted embodiment, and may further include other entities not illustrated in the depicted embodiment.

In the present example, each entity of the fabrication facility 1 interacts with the other entities via the network 20 to provide services to and/or receive services from the other entities. The network 20 may be a single network or a variety of different networks, such as an intranet, the Internet, another network, or a combination thereof. The network 20 includes wired communication channels, wireless communication channels, or a combination thereof.

The fabrication tool 30 performs an integrated circuit fabrication process. In the present example, the fabrication tool 30 may be, for example, a chemical vapor deposition (CVD) system, a physical vapor deposition (PVD) system, an etching system, a thermal oxidation system, an ion implantation system, a chemical mechanical polishing (CMP) system, a rapid thermal annealing (RTA) system, a photolithography system, a diffusion system, facility (FAC) system, etching (ETC) system or another semiconductor fabrication tool.

Figure 2:
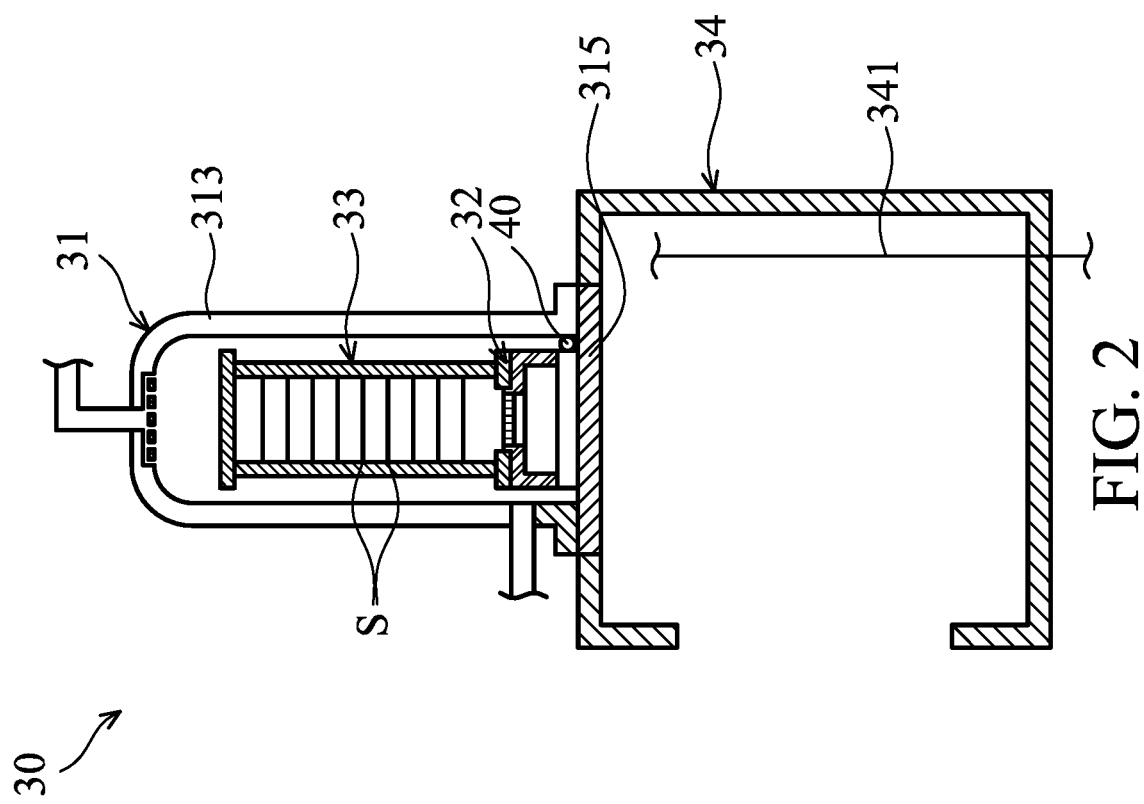
FIG. 2 shows a schematic view of a fabrication tool, in accordance with some embodiments.

FIG. 2 shows a schematic view of the fabrication tool 30, in accordance with some embodiments. In some embodiments, the fabrication tool 30 is a furnace configured for performing a CVD process. The formation of a film is carried out by subjecting a semiconductor wafer at elevated temperatures in the fabrication tool 30

In some embodiments, the fabrication tool 30 includes a reaction chamber 31, an insulation cap 32, a wafer boat 33, and a lower chamber 34. The reaction chamber 31 includes a tube 313 and a sealing lid 315. The tube 313 extends a height in its longitudinal axis Z. The upper end of the tube 313 is closed. The lower end of the tube 313 is open to allow the wafer boat 33 to be inserted and removed from the reaction chamber 31 for batch processing of the semiconductor wafer S. The sealing lid 315 is detachable from the lower end of the tube 313. The sealing lid 315 can be moved relative to the tube 313 by an elevating member (not show in figures). When the sealing lid 315 is connected to the tube 313, as shown in FIG. 2, a sealed environment is built in the reaction chamber 31.

The insulation cap 32 is configured to minimize the heat lost via the sealing lid 315. In some embodiments, the insulation cap 32 is fixed on an inner surface of the sealing lid 315 that faces the interior of the reaction chamber 31. The wafer boat 33 is adapted for supporting and holding a plurality of vertically-stacked semiconductor wafers S and allowing reactant gas to flow horizontally over the face of the semiconductor wafers S to build the desired oxidation layer thicknesses thereon. Since the sealing lid 315 is used to transfer the semiconductor wafers S into the process chamber, the lid is also referred to as a "transferring member" in the following descriptions.

The lower chamber 34 is positioned below the reaction chamber 31. The lower chamber 34 is configured for facilitating the transportation of the semiconductor wafers S from and into the wafer boat 33. In some embodiments, a number of chemical supply lines are positioned in the lower chamber 34 to facilitate the supply of a chemical used in processing the semiconductor wafers S into the reaction chamber 31. For example, as shown in FIG. 2, a chemical supply line 341 is vertically arranged in the lower chamber 34. The chemical supplied by the chemical supply lines 341 may include a liquid solution, a validate gas, etc.

Back to FIG. 1, the metrology tool 40 is configured to measure and collect data associated with the fabrication tool 30 during integrated circuit fabrication. For example, the metrology tool 40 includes a moisture meter and is used to measure the percentage of water in a given substance. This information can be used to determine if the material is ready for use, unexpectedly wet or dry, or otherwise in need of further inspection.

In some embodiments, the metrology tool 40 is positioned in a movable member in the fabrication facility 1. In the embodiments shown in FIG. 2, the metrology tool 40 is positioned on the transferring member 315. As a result, the metrology tool 40 is moveable with the transferring member 315. The processes for moving the transferring member 315 are outlined in detail in the descriptions relating of FIGS. 5A-5E.

In some embodiments, the metrology tool 40 is located at a position not directly exposing to the process chemical. For example, as shown in FIG. 2, the metrology tool 40 is positioned on the side wall of the insulation cap 32 and is positioned adjacent to the transferring member 315. As such, the metrology tool 40 is not subject to chemical erosion and heat in the reaction chamber. However, it should be appreciated that many variations and modifications can be made to embodiments of the disclosure. The metrology tool 40 may be positioned on the outer wall of the transferring member 315 and is located outside the reaction chamber 31. Alternatively, the metrology tool 40 may be positioned at the side wall of the lower chamber 34 and not moved with the transferring member 315.

Figure 3:
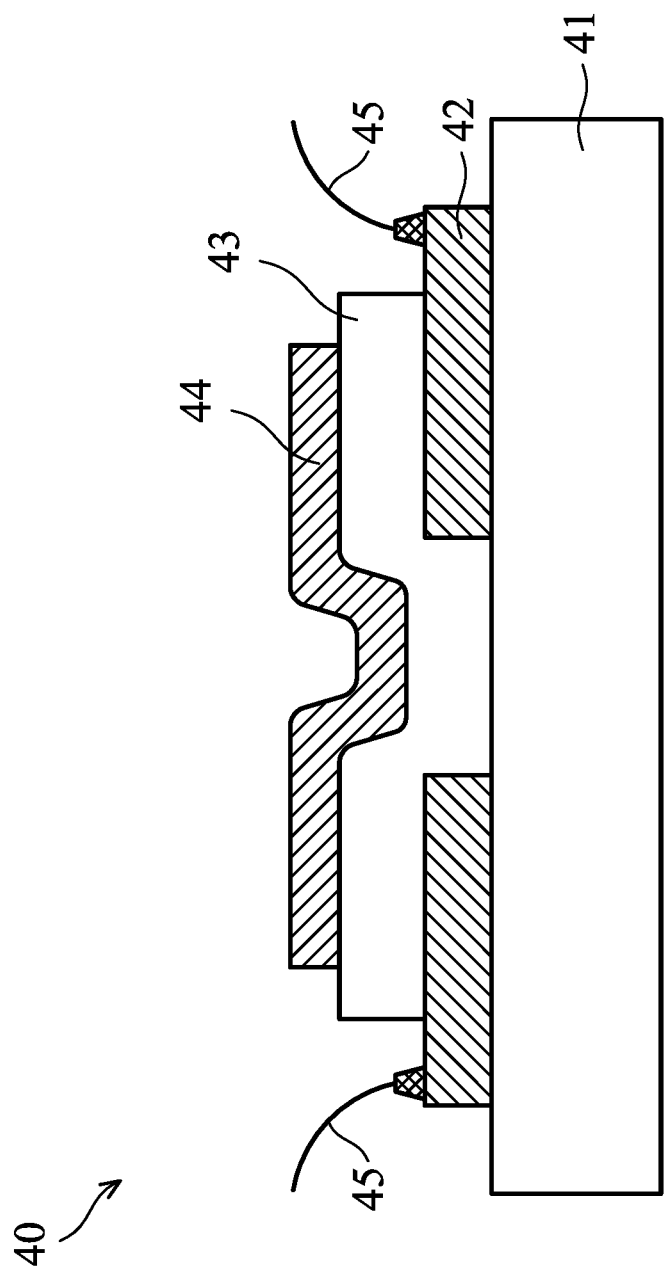
FIG. 3 shows a schematic view a metrology tool, in accordance with some embodiments.

FIG. 3 shows a schematic view of the metrology tool 40, in accordance with some embodiments. In some embodiments, the metrology tool 40 includes a substrate 41, a lower electrode 42, a polymeric film 43, an upper electrode 44, and a number of traces 45. The lower electrode 42 is positioned on the substrate 41. An opening is formed on the lower electrode 42. The polymeric film 43 is positioned on the lower electrode 42. A portion of the polymeric film 43 is depressed into the opening, and thus a recess is formed on an upper surface of the polymeric film 43. The upper electrode 44 is positioned on the polymeric film 43 and has a compatible shape with the polymeric film 43.

The upper electrode 44 may include a porous electrode. Moisture in the surroundings passing through the upper electrode 44 is absorbed by the polymeric film 43 and causes deformation of the polymeric film 43. In operation, electric current is applied to the lower electrode 42 via the traces 45, and by detecting the change in capacitance between the upper electrode 44 and the lower electrode 42, the humidity (amount of moisture) of the surroundings can be measured.

Back to FIG. 1 again, the APC system 50 can implement control actions in real time, wafer-to-wafer, lot-to-lot, or a combination thereof. In the depicted embodiments, the APC system 50 implements control actions to control the operation status of the fabrication tool 30. For example, the APC system 50 (based on inline metrology data) shouts down the operation of the fabrication tool 30 so as to stop a process event performed in the fabrication tool 30. In some other embodiments, the APC system 50 implements control actions to move transferring member 315 along predetermined path. For example, the APC system 50 moves the transferring member 315 toward the tube 313 and away from the tube 313.

In some other embodiments, the APC system 50 implements control actions to modify process recipe performed by the fabrication tool 30 and shut down the fabrication tool 30. For example, the APC system 50 (based on inline metrology data) modifies the predetermined process recipe (specifically the parameters implemented by the fabrication tool 30, such as process time, flow rate of gas, chamber pressure, chamber temperature, wafer temperature, or other process parameter) for each processed wafer to ensure that each processed wafer exhibits the target characteristics. In some embodiments, the APC system 50 modifies the predetermined process recipe by stopping the supply of the reaction gas into the process chamber.

The FDC system 60 evaluates conditions of the fabrication tool 30 to detect faults of the fabrication facility 1, such as chemical leakage in the fabrication tool 30, by monitoring the parameters implemented by the fabrication tool 30 before, during and after the integrated circuit fabrication process. Additionally, the FDC system 60 may evaluate wafer characteristics achieved by parameters implemented by the fabrication tool 30 during the integrated circuit fabrication process.

In some embodiments, the FDC system 60 implements statistical process control (SPC) to track and analyze the condition of the fabrication tool 30. For example, the FDC system 60 may implement SPC charts that document historical process data of the fabrication tool 30 by charting SPC data associated with the process over time. Such SPC data includes the parameters associated with the fabrication tool 30 or the fabrication facility 1.

When the SPC data indicates that parameters have departed from acceptable targets (in other words, when the FDC system 60 detects a fault or abnormality), the FDC system 60 triggers an alarm and notifies an operator or engineer of the fabrication tool 30, halt the process performed by the fabrication tool 30, take another action, or a combination thereof, so that any fault with the fabrication tool 30 may be identified and remedied.

The archive database 70 stores data associated with the fabrication facility 1, and particularly data associated with the integrated circuit fabrication processes. In the depicted embodiment, the archive database 70 stores data collected from the fabrication tool 30, the metrology tool 40, the APC system 50, the FDC system 60, the other entity 80, or a combination thereof.

For example, the archive database 70 stores data associated with wafer characteristics of wafers processed by the fabrication tool 30 (such as that collected by the metrology tool 40 as described below), data associated with parameters implemented by the fabrication tool 30 to process such wafers, data associated with analysis of the wafer characteristics and/or parameters by the APC system 50 and the FDC system 60, and other data associated with the fabrication facility 1. In one example, the fabrication tool 30, the metrology tool 40, the APC system 50, the FDC system 60, and other entity 80 may each have an associated database.

The archive database 70 may include a number of storage devices to provide storage of the information. The information may include raw data obtained directly from the metrology tool 40 and/or may include information from the fabrication tool 30. For example, the information from the metrology tool 40 is transferred to the archive database 70 and stored in the archive database 70 for archival purposes. The data from the metrology tool 40 may be stored in the original form (e.g., as obtained from the metrology tool 40 or the fabrication tool 30) and/or may be stored in its processed form (e.g., converted to digital signal from analog signal).

In the present example, to detect fault with the fabrication tool 30, the FDC system 60 monitors parameters associated with the fabrication tool 30. The FDC system 60 evaluates the parameters to detect abnormalities, or faults, during operation of the fabrication tool 30. In one example, an abnormality is indicated when, during a process, the humidity of the fabrication tool 30 varies (higher or lower) significantly from an expected humidity, such as the archival data stored in the archive database 70. Such abnormalities may indicate that there is a fault with the fabrication tool 30. For example, a leakage of chemical solution in the fabrication tool 30 may cause the humidity of the fabrication tool 30 to vary from the expected humidity.

Figure 4:
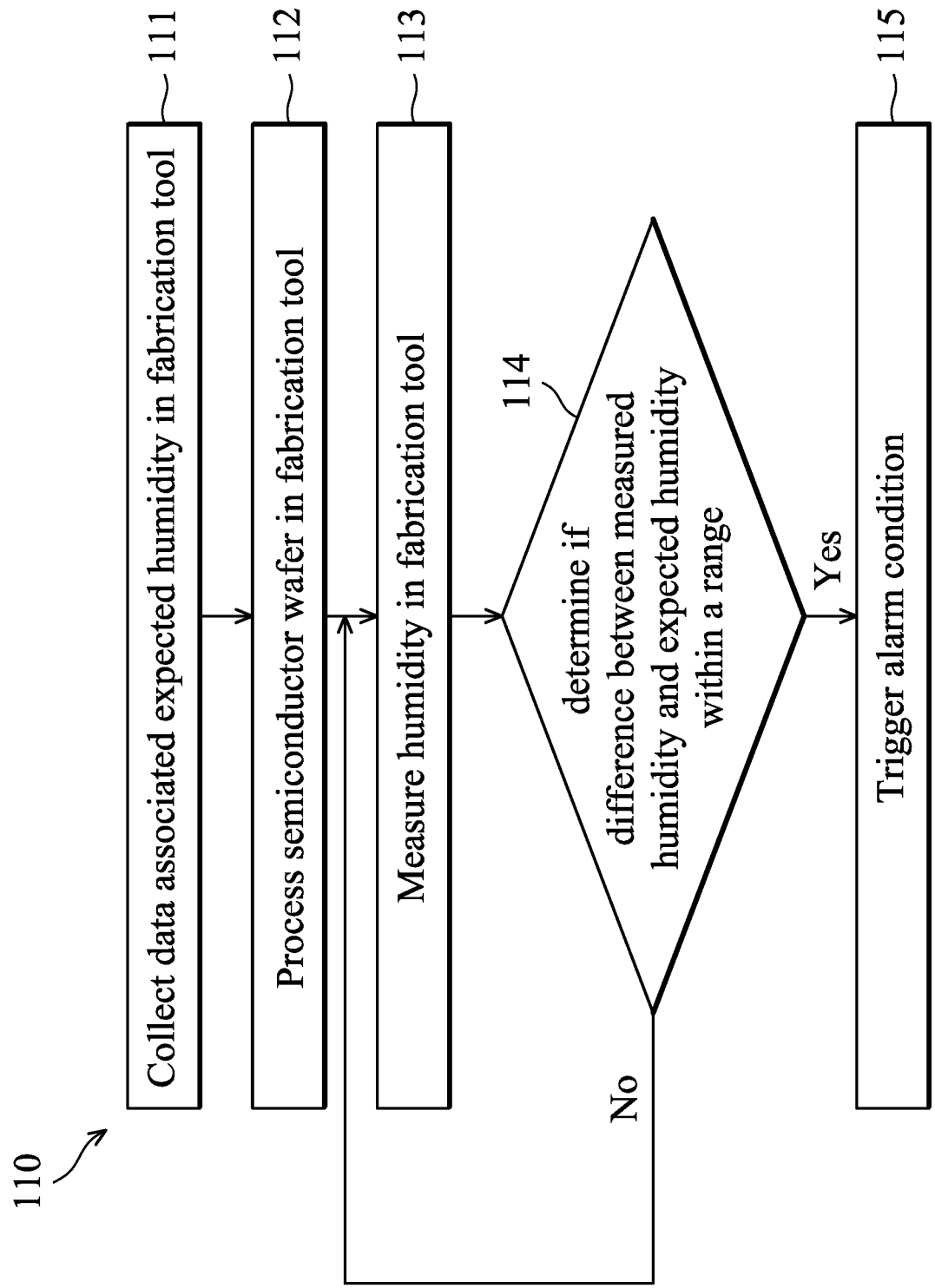
FIG. 4 is a simplified flowchart of a method of enabling fault detection in a fabrication tool, in accordance with some embodiments.

FIG. 4 is a simplified flowchart of a method 110 of enabling fault detection in the fabrication tool 30, in accordance with some embodiments. For illustration, the flow chart will be described along with the drawings shown in FIGS. 1-3, 5 and 6. Some of the described stages can be replaced or eliminated in different embodiments. The following discussion will take chemical vapor deposition (CVD) process tool as an example, and it is contemplated that the method 110 can be implemented by the fabrication facility 1 to monitor the condition of any type of fabrication tool 30 and any type of module of the fabrication tool 30.

The method 110 includes operation 111, in which data associated with the fabrication tool 30 is collected. In some embodiments, data associated with the fabrication tool 30 in one or more process runs is produced by the metrology tool 40 and is sent to the archive database 70. In each of the process run, a single semiconductor wafer, a lot, a batch, or any other grouping of semiconductor wafer S are processed by a set of process events.

For example, the metrology tool 40 measures the amount of moisture in the fabrication tool 30 in a number of process runs and sends the data associated with humidity to the archive database 70. The data is stored in the archive database 70, and the data in each process run are illustrated in table 1.1 below.

TABLE 1.1

| No. | EVENT NAME | EVENT TIME | HUMIDITY | LOCATION |
| --- | --- | --- | --- | --- |
| 1 | (a) Load wafer | 00:00:00 | 31 | 0 |
| 2 | (b) Boat up | 00:10:00 | 29 | 0 |
| 3 | (b) Boat up | 00:11:00 | 29 | 25 |
| 4 | (c) Purge gas | 00:20:00 | 29 | 50 |
| 5 | (d) Boat down | 01:30:00 | 16 | 25 |
| 6 | (d) Boat down | 01:31:00 | 15 | 0 |
| 7 | (e) Unload wafer | 01:40:00 | 15 | 0 |

In some embodiments, the table 1.1 includes five columns, where the columns include a data number column, an event name column, an event time column, a humidity column and a location column. For each of the process events, the event time column may record a time when the data is collected. The humidity column may record an amount of moisture at the event time. The location column may record a height of the metrology tool 40 in a vertical direction.

Figure 5A:
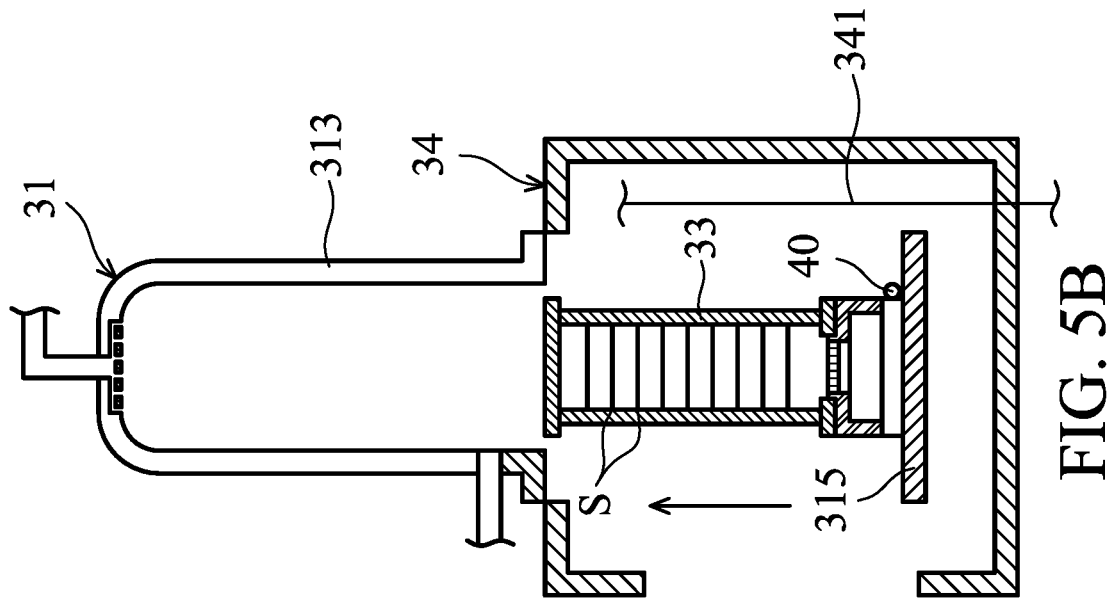
FIG. 5A shows a process event of a process run implemented by a fabrication tool as semiconductor wafers are loaded on a wafer boat, in accordance with some embodiments.
Figure 5B:
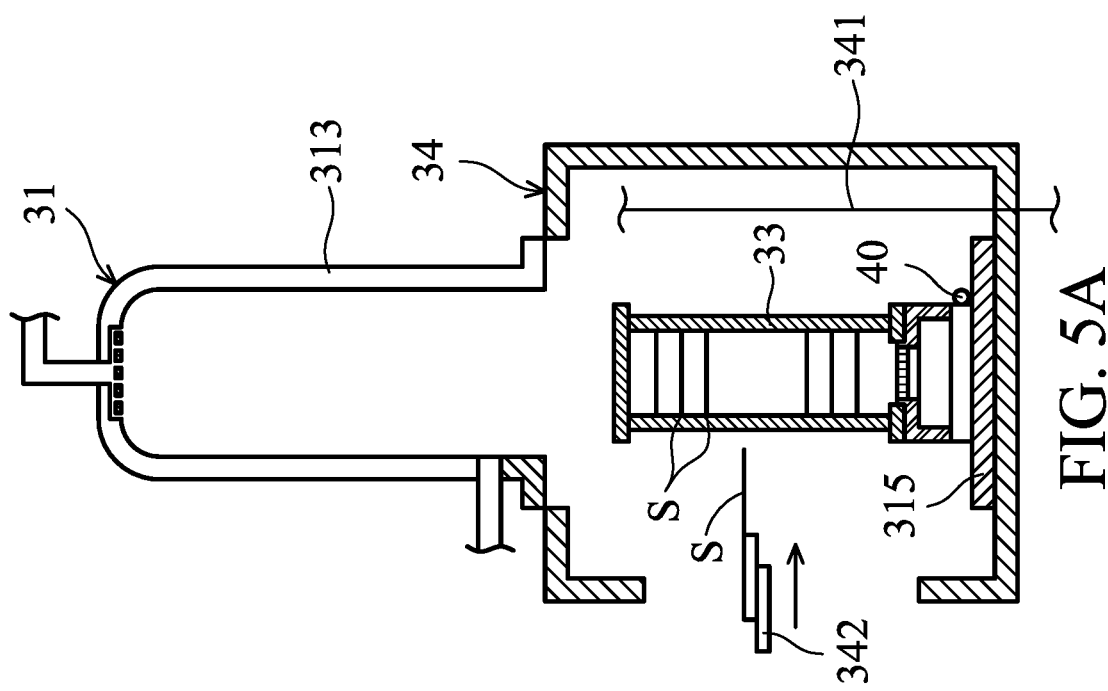
FIG. 5B shows a process event of a process run implemented by a fabrication tool as a wafer boat is loaded into a reaction chamber, in accordance with some embodiments.
Figure 5C:
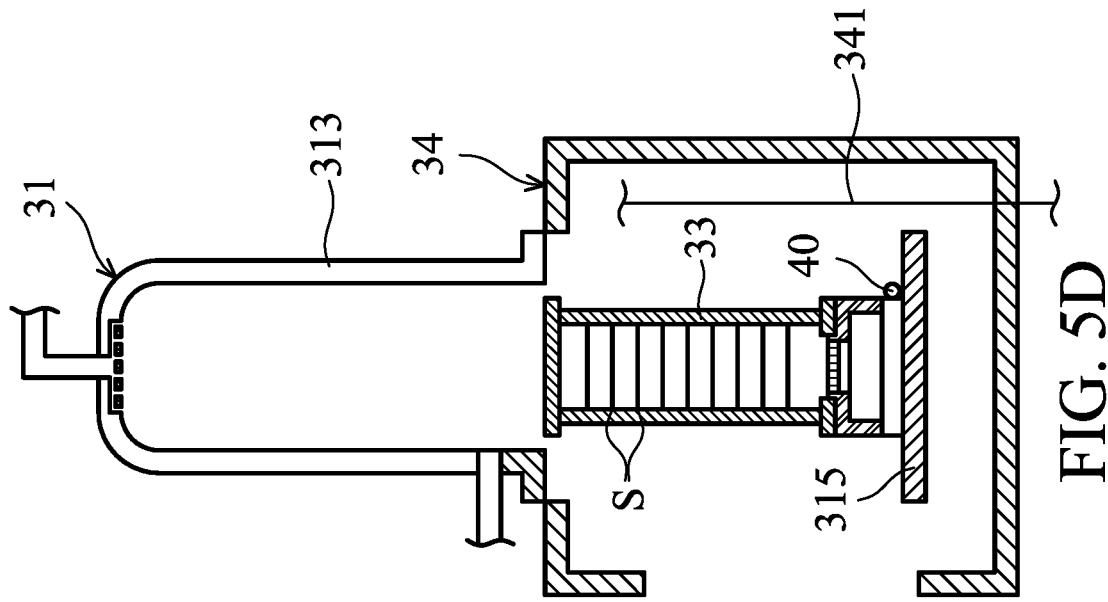
FIG. 5C shows a process event of a process run implemented by a fabrication tool as semiconductor wafers are processed in a reaction chamber, in accordance with some embodiments.

FIGS. 5A-5E show schematic views of the process events shown in table 1.1. In process event (a), as shown in FIG. 5A, semiconductor wafers S are loaded into the wafer boat 33 by a robotic arm 342 in the lower chamber 34. In process event (b), as shown in FIG. 5B, the lid 315 is moved toward the tube 313 and connected to the tube 313 to form an air-tight enclosure, as shown in FIG. 5C. When the lid 315 is connected to the tube 313, the wafer boat 33 is placed in the tube 313 and ready for processing.

Figure 5D:
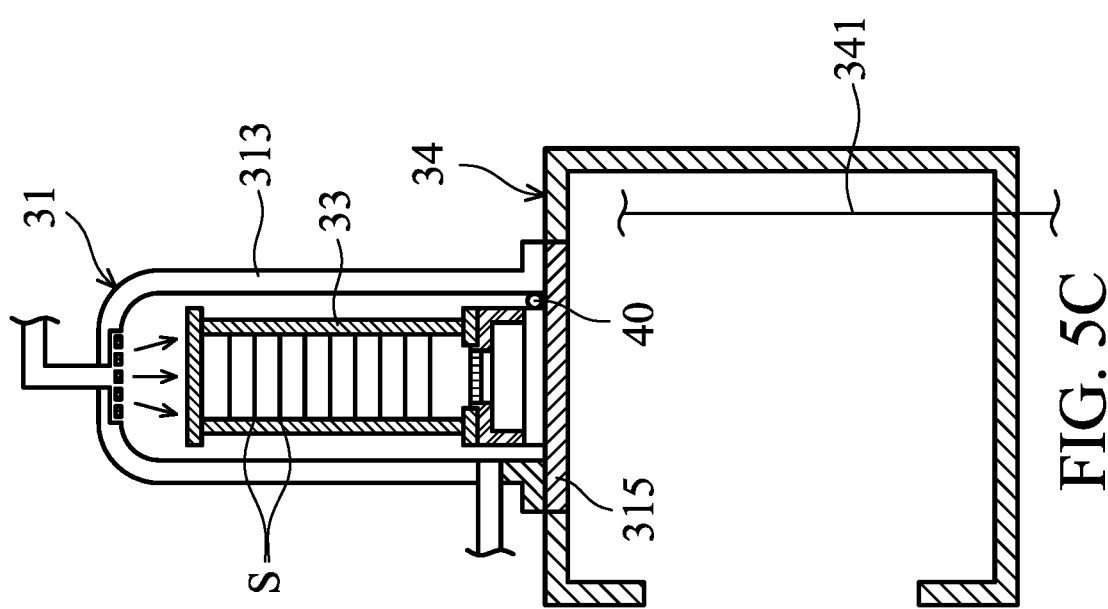
FIG. 5D shows a process event of a process run implemented by a fabrication tool as a wafer boat is removed from a reaction chamber, in accordance with some embodiments.
Figure 5E:
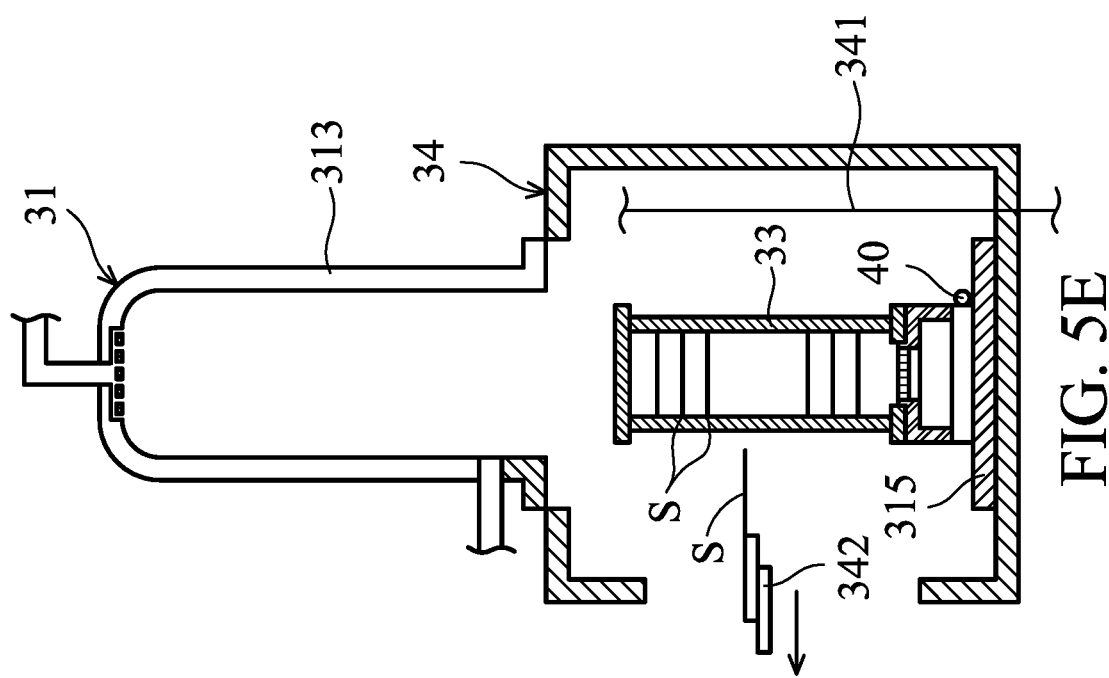
FIG. 5E shows a process event of a process run implemented by a fabrication tool as semiconductor wafers are unloaded from a wafer boat, in accordance with some embodiments.

In process event (c), as shown in FIG. 5C, reaction gas is purged into the reaction chamber 31 via the chemical supply line 341 so as to form a film on the semiconductor wafers S. In process event (d), as shown in FIG. 5D, the lid 315 is lowered down and is moved away from the tube 313 to pull the wafer boat 33 out of the tube 313. In process event (e), as shown in FIG. 5E, semiconductor wafers S are unloaded from the wafer boat 33 by the robotic arm.

It should be noted that, as shown FIGS. 5B and 5D, since the metrology tool 40 is moved together with the wafer boat 33, the humidity and the location recorded in table 1.1 in the process events (b) and (d) are varied. In addition, while only five events are shown in table 1.1, one or more process events may be added before or after process events (a)-(e), the disclosure should not be limited thereto.

The operation 111 may be repeated many times, as long as no fault is found in the fabrication tool 30 and the semiconductor wafer is processed properly (such as no contamination or having proper film thickness). Afterwards, data associated with the fabrication tool 30 detected at the selected locations is stored in the archive database 70.

The data may be further processed before being stored in the archive database 70. For example, a mean value of humidity measured in a specific process event of the last five normal process runs are calculated and stored in the archive database 70. Additionally, a standard deviation of humidity measured in a specific process event of the last five normal process runs are calculated and stored in the archive database 70. As a result, a big data pattern is stored in the archive database 70.

However, it should be appreciated that many variations and modifications can be made to embodiments of the disclosure. In some embodiments, operation 111 is omitted. The values of humidity in table 1.1 are applied into the archive database 70 by engineering/process knowledge. For example, when it has been observed that a normal condition in the fabrication tool 30 consistently occurs in a specific humidity, such humidity is established as normal humidity and is applied into archive database 70.

In some embodiments, data associated with the fabrication tool 30 is measured and recorded multiple times in some of the process events. For example, data associated with the fabrication tool 30 is measured multiple times in the process events (b) and (d) at regular time intervals, such as every 0.5 seconds, and the data associated with humidity at each measured time interval are recorded separately in the archive database 70. In this case, since the location of the metrology tool 40 is changed with time, the humidity correlated with location in the fabrication tool 30 is measured and recorded.

The method 110 also includes operation 112, in which another semiconductor wafer or another batch of semiconductor wafers S are processed in the fabrication tool 30. In some embodiments, the semiconductor wafers S are processed according to the same process events (a)-(e) shown in FIGS. 5A-5E.

The method 110 also includes operation 113, in which humidity in the fabrication tool 30 is measured by the metrology tool 40 while operation 112 is executed. In some embodiments, humidity in the fabrication tool 30 is measured in each of the process events of a process run performed in the fabrication tool 30. For example, humidity in each of the process events (a)-(e) shown in table 1.1 is measured. Humidity in each of the process events (a)-(e) may be measured multiple times at regular time intervals.

In some embodiments, at least one of the measurements in operation 113 corresponds to one of the measurements in operation 111. For example, the measurements in operation 113 occur at the same time of the process run with the measurements in operation 111. Additionally or alternatively, the measurements in operation 113 occur at the same location with the measurements in operation 111. In some embodiments, the number of measurements in operation 113 is the same as the number of measurements in operation 111. Alternatively, the number of measurements in operation 113 is less than the number of measurements in operation 111.

The method 110 also includes operation 114, in which the humidity measured in operation 113 is compared with an expected humidity stored in the archive database 70. In some embodiments, data associated with the humidity is derived from archive database 70 to the FDC system 60. Since the data associated with the humidity from the archive database 70 represents normal humidity on which the fabrication tool 30 can stably operate, this data is also referred to as "expected humidity". At the same time, the humidity measurements obtained in operation 113 are transmitted from the metrology tool 40 to the FDC system 60.

Figure 6A:
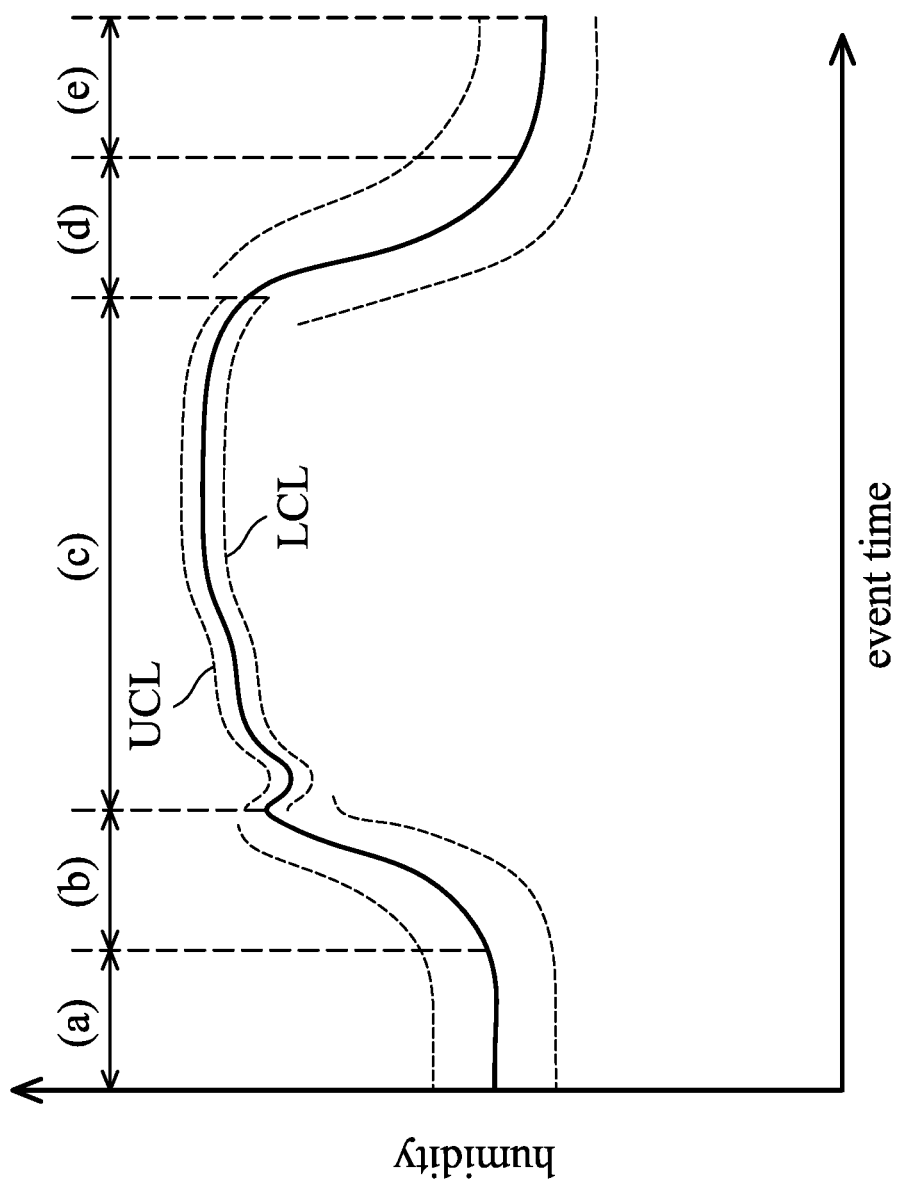
FIG. 6A is a diagram plotting expected humidity in a fabrication tool versus process time of a process run performed in the fabrication tool, upper control limits and lower control limits, in accordance with some embodiments.
Figure 6B:
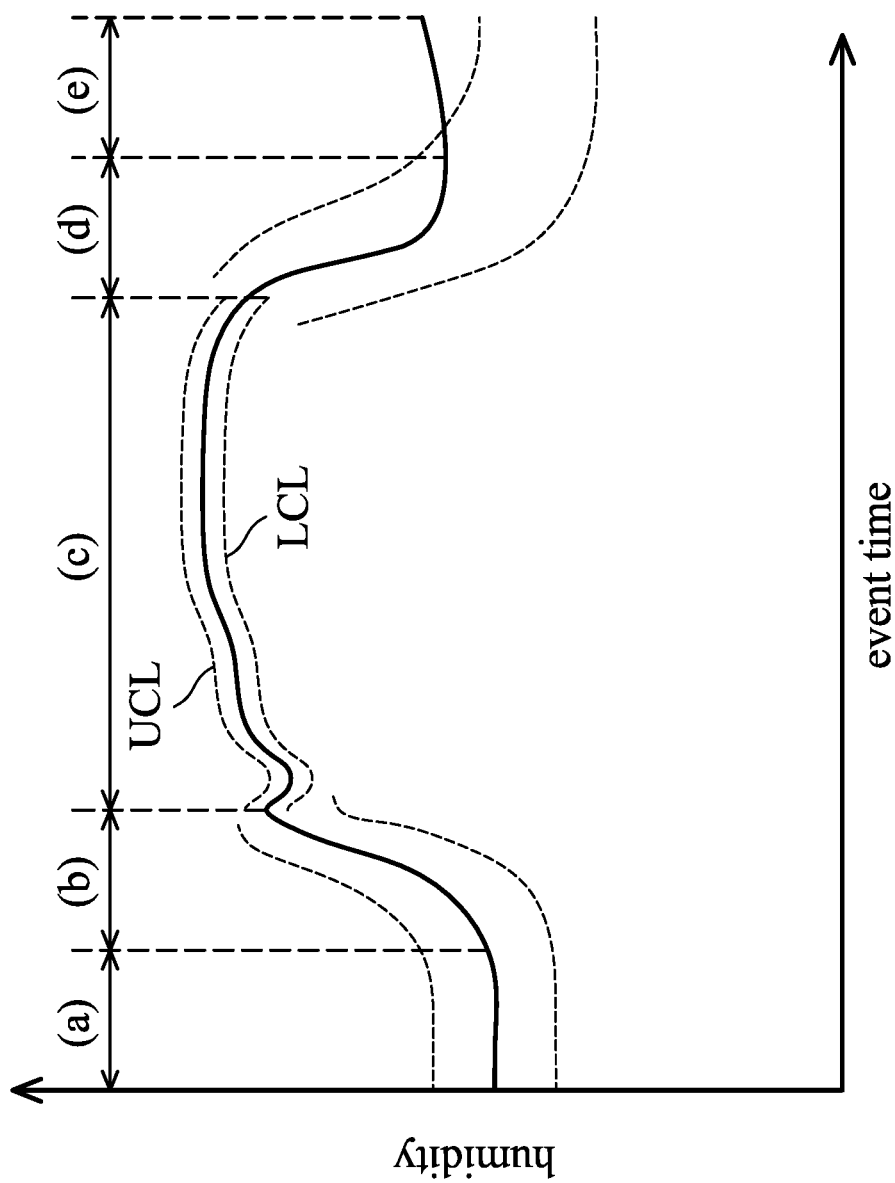
FIG. 6B is a diagram plotting humidity measurements in a fabrication tool versus process time of a process run performed in the fabrication tool, upper control limits and lower control limits, in accordance with some embodiments.

In some embodiments, the expected humidity is compiled in a time-series chart (T-chart) as shown in FIG. 6A, and the humidity measurements obtained in operation 113 is compiled in a time-series chart (T-chart) as shown in FIG. 6B.

In some embodiments, before analyzing the T-chart shown in FIG. 6B, a range of acceptable values for the difference between the humidity measurement and the expected humidity in each process event is determined. The range of acceptable values for the difference may be a standard deviation of the expected humidity in each process event. For example, as shown in FIG. 6A, upper control limits (UCL) are set at the expected humidity plus one standard deviation of the humidity, and lower control limits (LCL) are set at the expected humidity subtract one standard deviation of the humidity. The difference between the UCL and LCL at a specific time is referred to as the range of acceptable values.

Alternatively, the range of acceptable values for the difference may be a specific ratio of the expected humidity in each process event. For example, UCL are set at the expected humidity plus about 2% of the humidity, and LCL are set at the expected humidity subtract about 2% of the humidity. The difference between the UCL and LCL at a specific time is referred to as the range of acceptable values.

In some embodiments, the range of acceptable values for the difference in two process events may be different. For example, as shown in FIG. 6A, the range of acceptable values for the difference in process event (c) is smaller than the range of acceptable values for the difference in process event (a) because humidity in process event (a) may be changed by a variety of factors. However, it should be appreciated that many variations and modifications can be made to embodiments of the disclosure. The range of acceptable values for the difference in all process events of the process run may be the same.

After the range of acceptable values for the difference between the humidity measurement and the expected humidity is determined, the FDC system 60 compares the humidity measurement from the metrology tool 40 and the expected humidity from the archival database 70 to determine if the difference there between is within the range of acceptable values.

After the comparison, if the difference between the humidity measurement and the expected humidity is within the range of acceptable value, the method repeats operation 112-114 until all semiconductor wafers S are processed. However, if the difference between the humidity measurement and the expected humidity exceeds the range of acceptable values, the method continues with operation 115, in which an alarm condition is indicated. For example, as shown in FIG. 6B, in the process event (e), the humidity measurement is higher than the UCL. Namely, the different between the humidity measurement and the expected humidity is out of the range of acceptable values.

In some embodiments, when the data proceed by FDC system 60 indicates that the humidity measurement have departed from expected humidity (in other words, when the FDC system 60 detects a fault or abnormality), the FDC system 60 triggers an alarm. In some embodiments, out of specification data exhibits behavior that indicates a fault (or abnormality) in the fabrication tool 30. In the present example, exhibits behavior associated with a chemical leak (such as gas or liquid) in the fabrication tool 30.

It is observed that leakage of chemical, including liquid solution, volatile gas, etc., will cause an increase in humidity in fabrication tool 30. Therefore, to protect the fabrication tool 30 or the semiconductor wafer S from being damaged, the FDC system 60 triggers an alarm and notifies an operator of the fabrication tool 30, halt the process performed by the fabrication tool 30 via the APC system 60, take another action, or a combination thereof, so that any issues with the fabrication tool 30 may be identified and remedied to prevent wafer scrap from happening in the fabrication tool 30.

In some embodiments, the location where the leakage occurs can be determined by analyzing the comparison result. For example, as shown in FIG. 6B, since the alarm condition is triggered when the metrology tool 40 is located in the process event (e), the FDC system 60 may indicate that the leakage occurs in the lower chamber 34 (FIG. 5E). As a result, the fault of the fabrication tool 30 can be remedied as soon as possible.

Figure 7:
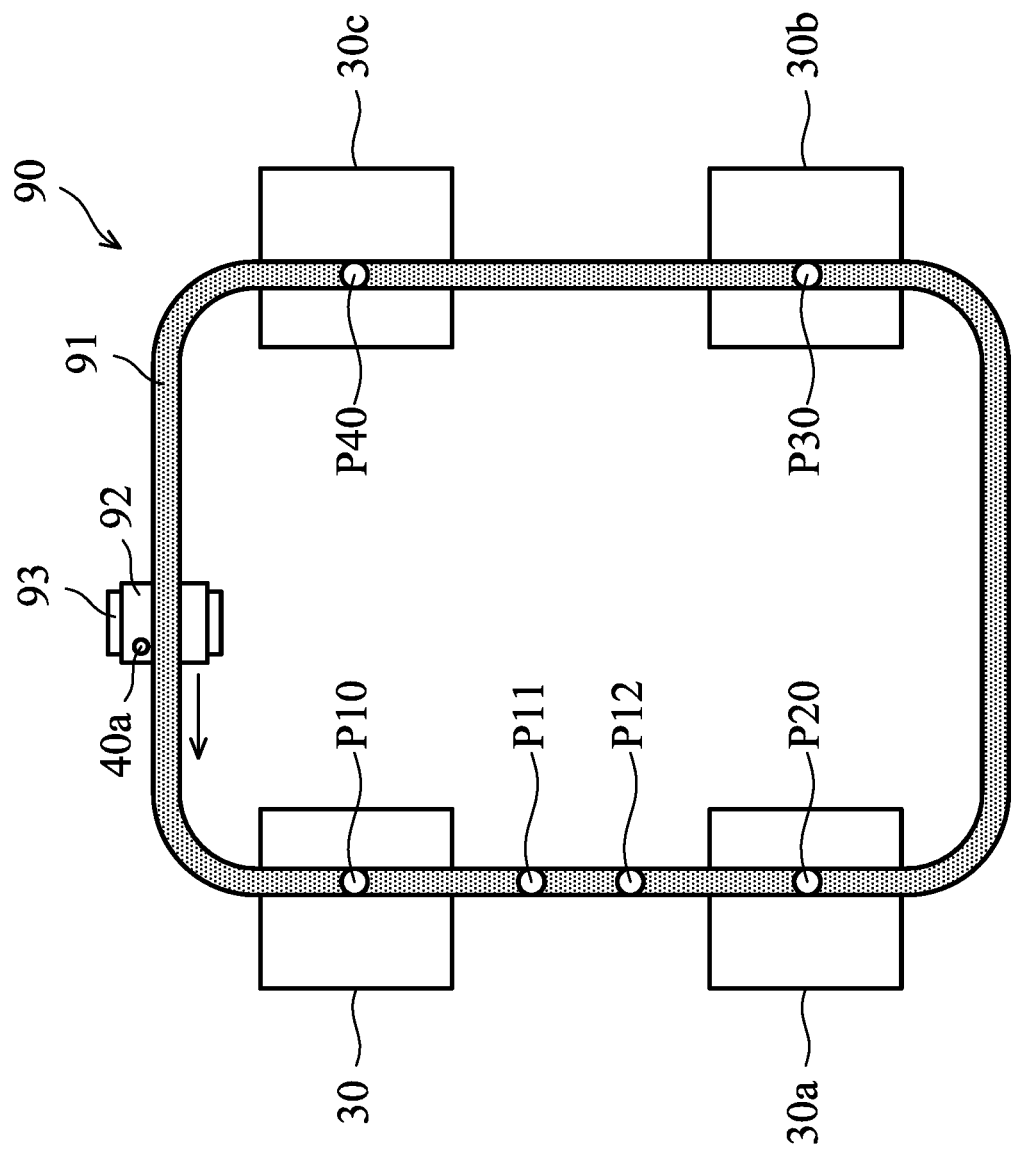
FIG. 7 shows a top view of a fabrication facility, in accordance with some embodiments.

FIG. 7 shows a top view of the fabrication facility 1, in accordance with some embodiments. In some embodiments, in addition to the mythology tool 40 positioned in the fabrication tool 30, a number of metrology tools such as metrology tool 40a are used for detecting fault in different positions in the fabrication facility 1. The metrology tool 40a may have the same structure as the above-described mythology tool 40. For brevity, the structure of the metrology tool 40a will not be elaborated again.

In some embodiments, the fabrication facility 1 further includes a number of fabrication tools 30a, 30b and 30c and a transporting apparatus 90. The fabrication tools 30a, 30b and 30c are different from the fabrication tool 30 and may be, for example, a chemical vapor deposition (CVD) system, a physical vapor deposition (PVD) system, an etching system, a thermal oxidation system, an ion implantation system, a chemical mechanical polishing (CMP) system, a rapid thermal annealing (RTA) system, a photolithography system, or another semiconductor fabrication tool.

In some embodiments, the transporting apparatus 90 includes a rail 91 positioned on the ceiling of the fabrication facility 1 and arranged over the fabrication tools 30, 30a, 30b and 30c. The transporting apparatus 90 also includes an overhead hoist vehicle 92 moveably positioned on the rail 91.

In addition, the transporting apparatus 90 includes a carrier 93 selectively grasped by the overhead hoist vehicle 92. The carrier 93, for example, is a standard mechanical interface (SMIF) or front opening unified pod (FOUP) with one or more semiconductor wafers S. The carrier 93 can be moved between the fabrication tool 30, 30a, 30b and 30c by the overhead hoist vehicle 92. When the carrier 93 is located on the fabrication tool 30, 30a, 30b and 30c, the semiconductor wafer S in the carrier 93 is transferred into the fabrication tool 30, 30a, 30b and 30c and processed.

In some embodiments, the metrology tool 40a is positioned on the overhead hoist vehicle 92. As a result, the metrology tool 40a is moved together with the overhead hoist vehicle 92 along the rail 91 to reach different locations in the fabrication facility 1 while the transporting apparatus 90 moves the overhead hoist vehicle 92 according to process events of a process flow. Since the overhead hoist vehicle 92 is used to transfer the carrier 93 in the fabrication facility 1, the overhead hoist vehicle 92 is also referred to as "transferring member" in the following descriptions.

Figure 8:
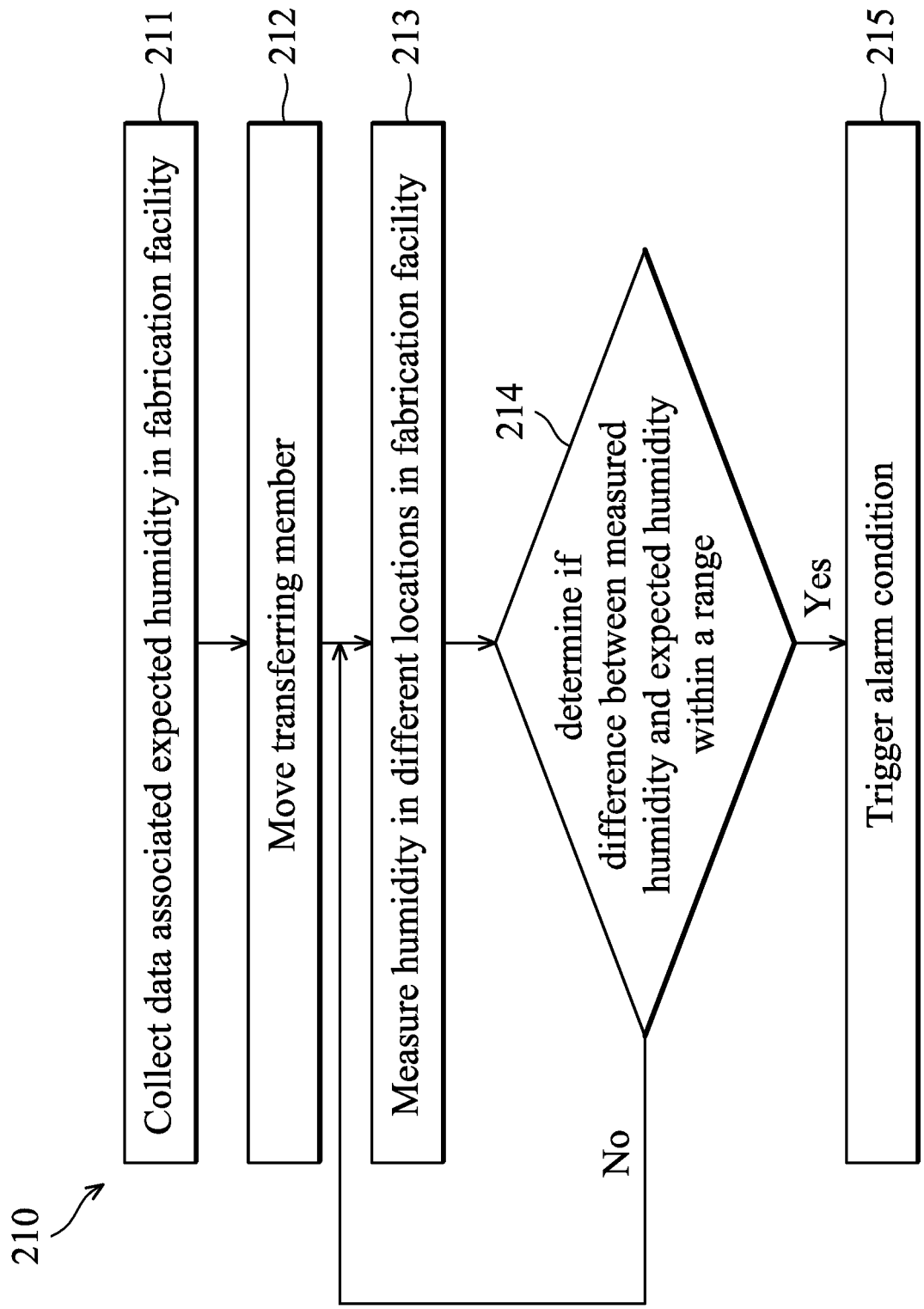
FIG. 8 is a simplified flowchart of a method of enabling fault detection in the fabrication facility, in accordance with some embodiments.

FIG. 8 is a simplified flowchart of a method 210 of enabling fault detection in the fabrication facility 1, in accordance with some embodiments. For illustration, the flow chart will be described along with the drawings shown in FIGS. 7 and 9-10. Some of the described stages can be replaced or eliminated in different embodiments.

The method 210 includes operation 211, in which data associated with the fabrication facility 1 is collected. In some embodiments, data associated with humidity at selected locations in the fabrication facility 1 is produced by the metrology tool 40a and is sent to the archive database 70.

In some embodiments, the data associated with humidity is collected at selected locations while the carrier 93 is transported by the transferring member 92 from one location to another location in the fabrication facility 1. Specifically, data associated with humidity is measured at locations P10 and P20 where the fabrication tool 30 and the fabrication tool 30a are located. The measurement may be executed while the carrier 93 is loaded to or unloaded from the fabrication tool 30 or 30a.

Alternatively or additionally, the data associated with humidity is measured multiple times during the transportation from locations P10 to location P20 at regular time intervals, such as every 0.5 seconds (2 points/sec), and the data associated with humidity at each measured time interval are recorded separately in the archive database 70. In this case, since the location of the metrology tool 40a is changed with time, the humidity correlated with location in the fabrication facility 1 is measured and recorded. The data is stored in the archive database 70, and the data in each process run are illustrated in table 1.2 below

TABLE 1.2

| No. | EVENT NAME | EVENT TIME | HUMIDITY | LOCATION |
|---|---|---|---|---|
| 1 | (f) Lift carrier | 00:00:00 | 15 | P10 |
| 3 | (g) Transfer | 00:01:20 | 15 | P11 |
| 4 | (g) Transfer | 00:01:40 | 15 | P12 |
| 5 | (h) Lower carrier | 00:02:00 | 15 | P20 |

The table 1.2 includes five columns, where the columns include a data number column, an event name column, an event time column, a humidity column and a location column. The event time column may record a time when the data is collected. The humidity column may record an amount of moisture in the location where the metrology tool 40a is located. For each of the process events, the event time column may record a time when the data is collected. The humidity column may record an amount of moisture at the event time. The location column may record location of the metrology tool 40 in the fabrication facility 1.

In some embodiments, the data associated with humidity is measured by a vacant transferring member 92 (i.e. no carrier is grasped by the overhead hoist vehicle 92). The transferring member 92 periodically patrols the fabrication facility 1 along a predetermined path, such as the rail 91, and the data associated with humidity is measured multiple times during the patrol. In this case, since the location of the metrology tool 40a is changed with time, the humidity correlated with location in the fabrication facility 1 is measured and recorded. The data is stored in the archive database 70, and the data in each process run are illustrated in table 1.3 below.

TABLE 1.3

| No. | EVENT NAME | EVENT TIME | HUMIDITY | LOCATION |
|---|---|---|---|---|
| 1 | (i) pass first point | 00:00:00 | 15 | P10 |
| 2 | (j) pass second point | 00:01:00 | 15 | P20 |
| 3 | (k) pass third point | 00:01:30 | 15 | P30 |
| 4 | (l) pass fourth point | 00:02:00 | 15 | P40 |

The table 1.3 includes five columns, where the columns include a data number column, an event name column, an event time column, a humidity column and a location column. The event time column may record a time when the data is collected. The humidity column may record an amount of moisture in the location where the metrology tool 40a is located. For each of the process events, the event time column may record a time when the data is collected. The humidity column may record an amount of moisture at the event time. The location column may record the location of the metrology tool 40 in the fabrication facility 1.

The operation 211 may be repeated many times, as long as no fault is found in the fabrication facility 1 (such as no chemical leakage). Afterwards, data associated with the fabrication facility 1 detected at the selected locations is stored in the archive database 70. The data may be further processed before being stored in the archive database 70. For example, a mean value of humidity measured at a specific location of the last five measurements are calculated and stored in the archive database 70. Additionally, a standard deviation of humidity measured at a specific location of the last five measurements are calculated and stored in the archive database 70. As a result, a big data pattern is stored in the archive database 70.

However, it should be appreciated that many variations and modifications can be made to embodiments of the disclosure. In some embodiments, operation 211 is omitted. The values of humidity in table 1.2 or table 1.3 are applied into the archive database 70 by engineering/process knowledge. For example, when it has been observed that a normal condition in the fabrication facility 1 consistently occurs in a specific humidity, such humidity is established as normal humidity and is applied into archive database 70.

The method 210 also includes operation 212, in which the transferring member 92 is moved in the fabrication facility 1. In some embodiments, the transferring member 92 is moved along the same process events of the process flow, such as process events (f)-(h) in table 1.2, with the carrier 93. In some embodiments, the transferring member 92 is moved along the same process events of the process flow, such as process events (i)-(l) in table 1.3, without the carrier 93. The movement of the transferring member 92 may be controlled by the APC system 50.

The method 210 also includes operation 213, in which humidity in the fabrication facility 1 is measured by the metrology tool 40a at selected locations while operation 212 is executed. In some embodiments, at least one of the measurements in operation 213 corresponds to one of the measurements in operation 211. For example, the measurements in operation 213 occur at the same location with the measurements in operation 211. In some embodiments, the number of measurements in operation 213 is the same as the number of measurements in operation 211. Alternatively, the number of measurements in operation 213 is less than the number of measurements in operation 211.

The method 210 also includes operation 214, in which the humidity measured in operation 213 is compared with an expected humidity stored in the archive database 70. In some embodiments, data associated with the expected humidity at different locations is derived from archive database 70 to the FDC system 60. Since the data associated with the expected humidity from the archive database 70 represents normal humidity of the fabrication facility 1, this data is also referred to as "expected humidity". While at the same time, the humidity measurements obtained in operation 213 are transmitted from the metrology tool 40a to the FDC system 60.

Figure 9A:
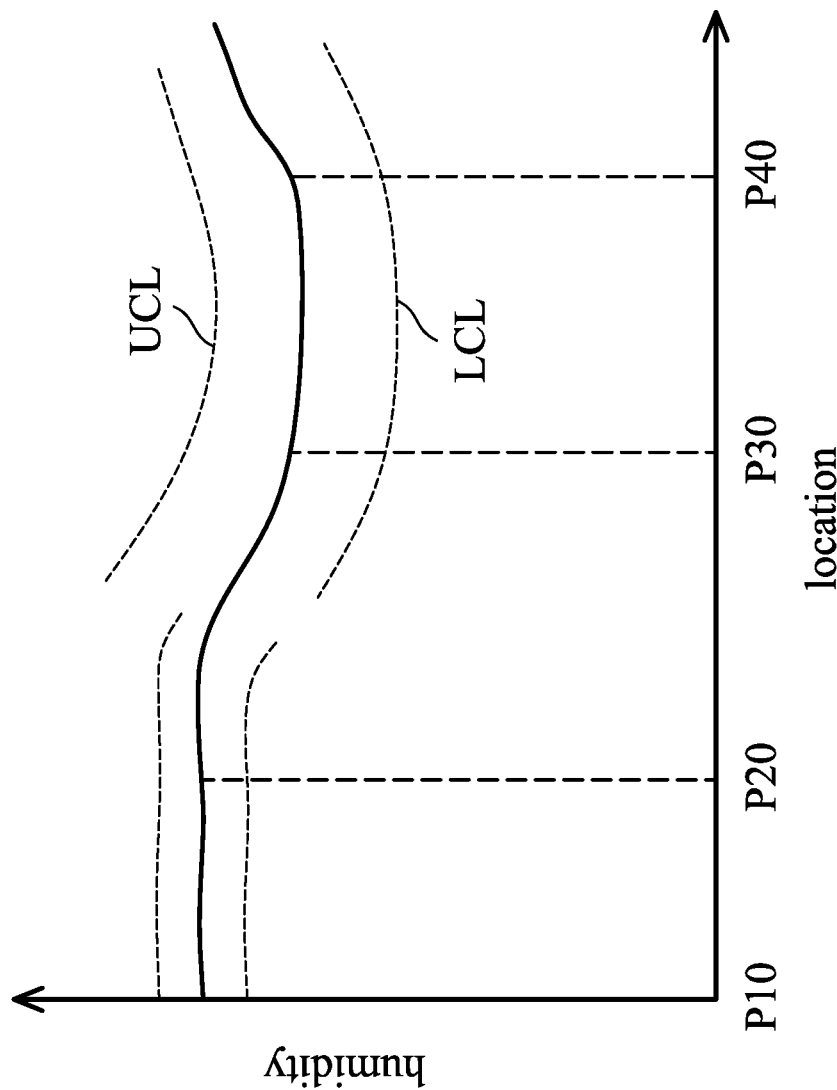
FIG. 9A is a diagram plotting expected humidity versus a number of selected locations in a fabrication facility with upper control limits, upper control limits and lower control limits, in accordance with some embodiments.
Figure 9B:
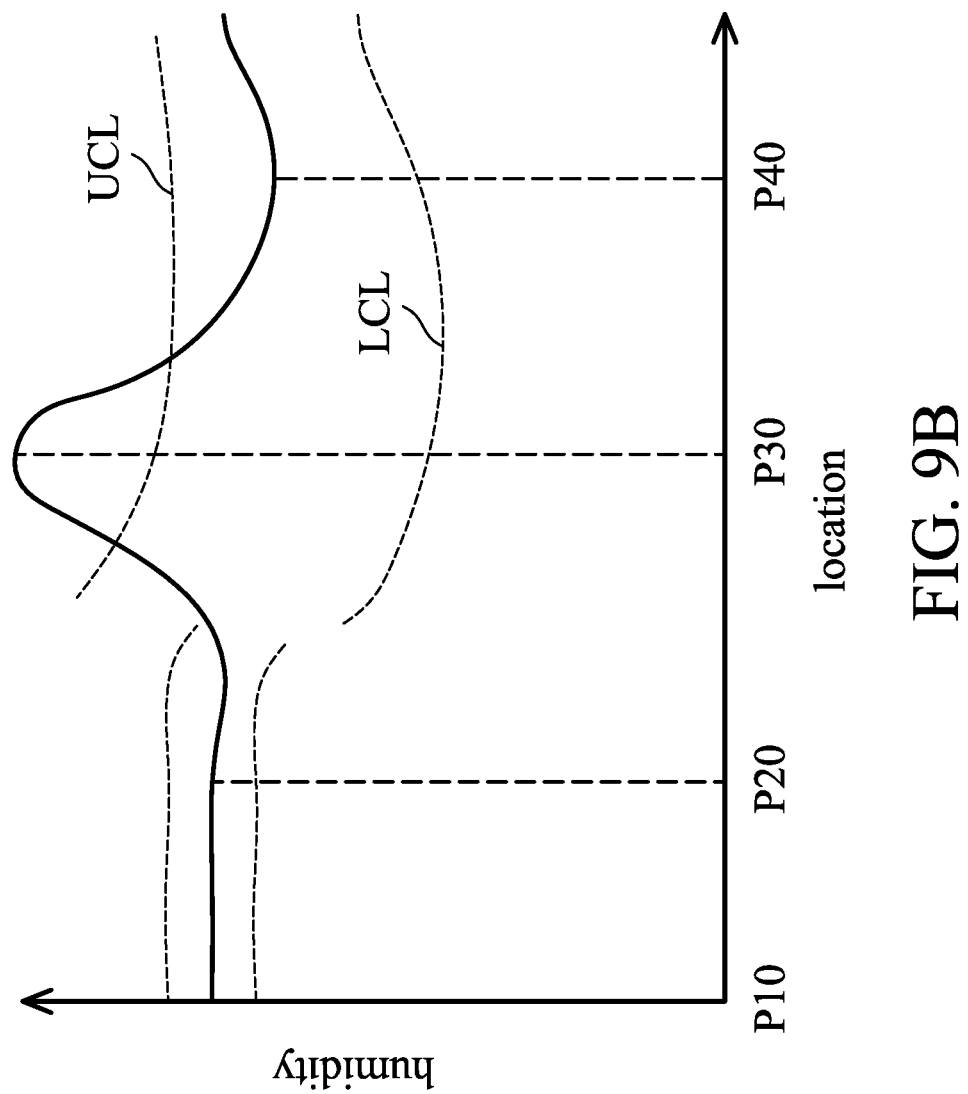
FIG. 9B is a diagram plotting humidity measurements versus number of selected locations in a fabrication facility, upper control limits and lower control limits, in accordance with some embodiments.

In some embodiments, the expected humidity is compiled in time-series chart (T-chart) as shown in FIG. 9A, and the humidity measurements obtained in operation 213 is compiled in time-series chart (T-chart) as shown in FIG. 9B.

In some embodiments, before analyzing the T-chart shown in FIG. 9B, a range of acceptable values for the difference between the humidity measurement and the expected humidity at each selected location is determined. The range of acceptable values for the difference may be a standard deviation of the expected humidity at each location. For example, as shown in FIG. 9A, upper control limits (UCL) are set at the expected humidity plus one standard deviation of the expected humidity, and lower control limits (LCL) are set at the expected humidity subtract one standard deviation of the expected humidity. The difference between the UCL and LCL at a specific time is referred to as the range of acceptable values.

Alternatively, the range of acceptable values for the difference may be a specific ratio of the expected humidity at each selected location. For example, UCL are set at the expected humidity plus about 2% of the expected humidity, and LCL are set at the expected humidity subtract about 2% of the expected humidity. The difference between the UCL and LCL at a specific time is referred to as the range of acceptable values.

In some embodiments, the range of acceptable values for the difference at two locations may be different. For example, as shown in FIG. 9A, the range of acceptable values for the difference at location P10 is smaller than the range of acceptable values for the difference at location P30 because humidity at location P30 may be changed by a variety of factors. However, it should be appreciated that many variations and modifications can be made to embodiments of the disclosure. The range of acceptable values for the difference in all locations may be the same.

After the range of acceptable values for the difference between the humidity measurement and the expected humidity is determined, the FDC system 60 compares the humidity measurement at a selected location and the expected humidity corresponding to the same location to determine if the difference there between is within the range of acceptable values.

After the comparison, if the difference between the humidity measurement and the expected humidity is within the range of acceptable value, the method repeats operation 212-214. However, if the difference between the humidity measurement and the expected humidity exceeds the range of acceptable values, the method continues with operation 215, in which an alarm condition is indicated.

In some embodiments, when the data proceed by the FDC system 60 indicates that the humidity measurement have departed from expected humidity (in other words, when the FDC system 60 detects a fault or abnormality), the FDC system 60 triggers an alarm. In some embodiments, out of specification data exhibits behavior that indicates a fault (or abnormality) in the fabrication tool 30. In the present example, statistically analyzed parameter data is out of specification when it exhibits behavior associated with a chemical leak (such as gas or liquid) in the fabrication tool 30.

It is observed that leakage of chemical, including liquid solution, volatile gas, etc., will cause an increase in humidity in fabrication tool 30. Therefore, to protect the fabrication facility 1 or the semiconductor wafer S from being damaged, the FDC system 60 notifies an operator and indicates the location where the fault occurs so that any issues of the fabrication facility 1 may be identified and remedied.

On the other hand, the FDC system 60 may optionally halts the process performed by the process tools located around the location where the fault occurs directly or through the control of APC system 50. For example, when the FDC system 60 notifies a fault occurs at a location P11 between locations P10 and P20 where the fabrication tools 30 and 30a are situated, the FDC system 60 halts the process performed by the fabrication tools 30a and 30b to prevent wafer scrap from happening in the process tools 30a and 30b directly or through the APC system 50.

Embodiments of method for fault detection in a fabrication facility uses real time measured humidity to detect chemical leakage. The measure humidity is compared with an expected humidity measured in the same condition, so that it is possible to more accurately determine whether or not the abnormal condition is generated. When an abnormal situation occurs, the FDC system will take immediate response and inform maintenance personnel to properly handle it. As a result, damage to the fabrication tool for processing semiconductor wafers can be mitigated or avoided and wafer scarp is reduced.

In accordance with some embodiments, a method for fault detection in a fabrication tool is provided. The method includes processing a semiconductor wafer in a fabrication tool according to a plurality of process events of a process run. The method further includes measuring humidity in the fabrication tool in at least one of the process events. The method also includes comparing the humidity measured in one of the process events with an expected humidity associated with the process event. In addition, the method includes based on the comparison, indicating an alarm condition when a difference between the measured humidity and the expected humidity exceeds a range of acceptable values associated with the process event.

In accordance with some embodiments, a method for fault detection in a fabrication facility is provided. The method includes moving a transferring member. The method further includes measuring the humidity at a plurality of selected locations using a metrology tool positioned on the transferring member. The method also includes comparing the humidity measured at one of the selected locations with an expected humidity associated with the one of the selected locations. In addition, the method includes based on the comparison, indicating an alarm condition when the difference between the measured humidity and the expected humidity exceeds a range of acceptable values associated with the one of the selected locations.

In accordance with some embodiments, a fabrication facility is provided. The fabrication facility includes a transferring member movable in different locations. The fabrication facility further includes a metrology tool positioned on the transferring member. The fabrication facility also includes a fault detection and classification (FDC) system. The FDC system is used to receive humidity measurements associated with humidity at a plurality of selected locations from the metrology tool. The FDC system is also used to compare one of the humidity measurements associated with one of the selected locations with an expected humidity associated with the same location.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for fault detection in a fabrication tool, comprising:
   processing a semiconductor wafer in a fabrication tool according to a plurality of process events of a process run, wherein the process events correspond to different locations in the fabrication tool;
   measuring humidity in the fabrication tool in at least one of the process events by a metrology tool positioned on a transferring member, and recording a location of the metrology tool, wherein the transferring member is moved in the fabrication tool according to the process events;
   comparing the humidity measured in one of the process events with an expected humidity associated with the one of the process events;
   based on the comparison, indicating an alarm condition which is indicative of a chemical leakage in the fabrication tool when a difference between the measured humidity and the expected humidity exceeds a range of acceptable values associated with the one of the process events, and determining a component that is a source of the chemical leakage;
   collecting data associated with humidity in the fabrication tool in each of the process events of a previously executed process run; and
   storing the data associated with humidity in an archive database, wherein the expected humidity is derived from the archive database.

2. The method for fault detection in the fabrication tool as claimed in claim 1, further comprising:
   stopping operation of the fabrication tool upon indication of the alarm condition.

3. The method for fault detection in the fabrication tool as claimed in claim 1, wherein the fabrication tool is a reaction chamber, and the reaction chamber comprises a tube and a lid that is detachable from the tube;
   wherein the humidity is measured with a metrology tool positioned on the lid.

4. The method for fault detection in the fabrication tool as claimed in claim 1, wherein the process events comprises:
   loading the semiconductor wafer into a reaction chamber;
   processing the semiconductor wafer in the reaction chamber; and
   unloading the semiconductor wafer from the reaction chamber.

5. The method for fault detection in the fabrication tool as claimed in claim 1, wherein the humidity, in each process event, is measured multiple times by a predetermined time interval in a single process event;
   wherein the comparison comprises calculating difference between the humidity measured at different times with the expected humidity at the corresponding times.

6. The method for fault detection in the fabrication tool as claimed in claim 1, wherein the ranges of acceptable values in two of the process events of the process run are different.

7. The method for fault detection in the fabrication tool as claimed in claim 1, wherein the humidity is measured by a metrology tool, and the metrology tool is positioned on a transferring member.

8. The method for fault detection in the fabrication tool as claimed in claim 7, wherein the metrology tool comprising:
   a substrate;
   a lower electrode, positioned on the substrate, and an opening is formed on the lower electrode;
   a polymeric film, positioned on the lower electrode, wherein a portion of the polymeric film is extended into the opening, and a recess is formed on an upper surface of the polymeric film;
   an upper electrode, positioned on the polymeric film.

9. The method for fault detection in the fabrication tool as claimed in claim 8, wherein the humidity is measured by detecting the change in capacitance between the upper electrode and the lower electrode.

10. The method for fault detection in the fabrication tool as claimed in claim 8, the upper electrode comprises a porous electrode.

11. A method for fault detection in a fabrication facility, comprising:
    moving a transferring member in the fabrication facility;
    measuring the humidity at a plurality of selected locations using a metrology tool positioned on the transferring member and recording a location of the metrology tool;
    comparing the humidity measured at one of the selected locations with an expected humidity associated with the one of the selected locations;
    based on the comparison, indicating an alarm condition which is indicative of a chemical leakage when the difference between the measured humidity and the expected humidity exceeds a range of acceptable values associated with the one of the selected locations, and determining a component that is a source of the chemical leakage;
    collecting data associated with humidity at each of the selected locations in a previous movement of the transferring member; and
    storing data associated with humidity in the previous movement of the transferring member in an archive database, wherein the expected humidity is derived from the archive database.

12. The method for fault detection in the fabrication facility as claimed in claim 11, further comprising:
    stopping operation of a fabrication tool located around the one of the selected locations upon indication of the alarm condition.

13. The method for fault detection in the fabrication facility as claimed in claim 11, wherein the transferring member is an overhead hoist vehicle, and the method further comprises:
    moving the overhead hoist vehicle along a rail positioned over a plurality of fabrication tools;
    wherein the humidity at the selected locations are measured with a metrology tool positioned on the overhead hoist vehicle while the overhead hoist vehicle is moved on the rail.

14. The method for fault detection in the fabrication facility as claimed in claim 11, wherein the transferring member is a lid of a furnace on which a wafer boat for carrying a plurality of semiconductor wafers is disposed, and the method further comprises:
    moving the lid toward a tube so as to insert the wafer boat into the tube;

wherein humidity at the selected locations are measured with a metrology tool positioned on the lid before, during and after the movement of the lid relative to the tube.

15. The method for fault detection in the fabrication facility as claimed in claim 11, wherein the humidity is periodically measured at regular time intervals.

16. The method for fault detection in the fabrication facility as claimed in claim 11, wherein the ranges of acceptable values in two of the selected locations are different.

17. A fabrication facility, comprising:
a transferring member movable in different locations;
a metrology tool positioned on the transferring member; and
a fault detection and classification system configured to:
receive humidity measurements associated with humidity at a plurality of selected locations from the metrology tool;
compare one of the humidity measurements associated with one of the selected locations with an expected humidity associated with the same location;
collect data associated with humidity at each of the selected locations in a previous movement of the transferring member;
store data associated with humidity in the previous movement of the transferring member in an archive database, wherein the expected humidity is derived from the archive database; and
indicate an alarm condition which is indicative of a chemical leakage when the difference between the measured humidity and the expected humidity exceeds a range of acceptable values, and determine a component that is a source of the chemical leakage based on the comparison.

18. The fabrication facility as claimed in claim 17, wherein the fault detection and classification system is further configured to issue an alarm when the difference between the humidity measurement and the expected humidity at the same location exceeds a range of acceptable values in one of the selected locations.

19. The fabrication facility as claimed in claim 17, further comprising:
a plurality of fabrication tools; and
a rail positioned above the fabrication tools;
wherein the transferring member comprises an overhead hoist vehicle positioned on the rail in a movable manner.

20. The fabrication facility as claimed in claim 17, wherein the transferring member comprises a lid on which a boat for carrying a plurality of semiconductor wafers is disposed.

* * * * *